United States Patent [19]

Huang

[11] Patent Number: 5,342,798
[45] Date of Patent: Aug. 30, 1994

[54] METHOD FOR SELECTIVE SALICIDATION OF SOURCE/DRAIN REGIONS OF A TRANSISTOR

[75] Inventor: Tiao-Yuan Huang, Cupertino, Calif.

[73] Assignee: VLSI Technology, Inc., San Jose, Calif.

[21] Appl. No.: 156,166

[22] Filed: Nov. 23, 1993

[51] Int. Cl.[5] .................................. H01L 21/265
[52] U.S. Cl. ...................... 437/41; 437/56; 437/200; 437/913; 148/DIG. 117; 148/DIG. 147
[58] Field of Search ................. 437/41, 913, 200, 201, 437/56, 57, 58, 979, 985; 148/DIG. 147, DIG. 116, DIG. 117, DIG. 118

[56] References Cited

U.S. PATENT DOCUMENTS

| | | | |
|---|---|---|---|
| 4,627,153 | 9/1986 | Masuoka | 437/979 |
| 4,866,002 | 9/1989 | Shizukuishi et al. | 437/57 |
| 4,874,713 | 10/1989 | Gioia | 437/57 |
| 5,106,768 | 4/1992 | Kuo | 148/DIG. 116 |
| 5,187,122 | 2/1993 | Bonis | 437/200 |
| 5,194,405 | 3/1993 | Sumi et al. | 148/DIG. 118 |
| 5,262,344 | 11/1993 | Mistry | 437/200 |

OTHER PUBLICATIONS

Y. Wei, Y. Loh, C. Wang and C. Hu, *MOSFET Drain Engineering for EDS Performance*, EOS/ESD Symposium, 1992, pp. 143–148.

*Silicon Processing for the VLSI Era—vol. 2, Process Integration*, pp. 144–152, 154, 155, 1986.

C. Duvvury, R. N. Rountree, Y. Fong, and R. A. McPhee, *ESD Phenomena and Protection Issues in CMOS Output Buffers*, IEEE/IRPS, 1987, pp. 174–180.

D. Krakauer, K. Mistry, *ESD Proection in a 3.3 Volt Sub-Micron Silicided CMOS Technology*, EOS/ESD Symposium, 1992, pp. 250–257.

T. Yamaguchi, et al., *High-Speed Latchup-Free 0.5μm–Channel CMOS Using Self-Aligned TiSi$_2$ and Deep–Trench Isolation Technologies*, IEDM 83, 243., 1983, pp. 522–525.

*Primary Examiner*—Tom Thomas
*Assistant Examiner*—Michael Trinh
*Attorney, Agent, or Firm*—Douglas L. Weller

[57] ABSTRACT

Selective salicidation of source/drain regions of a transistor is accomplished by performing an implant into a first plurality of transistor source/drain regions on an integrated circuit. As a result of the implant, doping density of the first plurality of transistor source/drain regions is greater than doping density of a second plurality of transistor source/drain regions on the integrated circuit. The integrated circuit is heated to a heating temperature sufficient to produce oxidation regions immediately over the first plurality of transistor source/drain regions and the second plurality of transistor source/drain regions. The heating temperature is chosen so that the oxidation regions immediately over the first plurality of transistor source/drain regions are thicker than the oxidation regions immediately over the second plurality of transistor source/drain regions. A metal layer is formed over the first plurality of transistor source/drain regions and the second plurality of transistor source/drain regions. The metal layer is annealed at a temperature such that the metal reacts to form metal-silicide over the second plurality of transistor source/drain regions, but not over the first plurality of transistor source/drain regions. The unreacted metal is stripped off over the first plurality of transistor source/drain regions.

20 Claims, 8 Drawing Sheets

METHOD FOR SELECTIVE SALICIDATION OF SOURCE/DRAIN REGIONS OF A TRANSISTOR

BACKGROUND

This invention relates to selective salicidation of source/drain regions of a transistor, for example, for use in the production of electro-static discharge (ESD) transistors connected to circuit input/output pads and used to protect semiconductor devices from damage resulting from electrostatic discharge.

As the size of circuitry within integrated circuits continues to decrease, it is often desirable to include a metal-silicide region as part of the source/drain region. This minimizes the series source/drain resistance and avoids transistor performance degradation. See for example, *Silicon Processing for the VLSI Era—Volume 2, Process Integration*, pp. 144–152.

However, using metal-silicide regions in source-drain regions of electrostatic discharge (ESD) transistors can be detrimental to circuit performance. ESD can be a source of destruction for semiconductor devices. Various input protection circuits may be used to protect the input circuits from electrostatic discharge damage. However, these same protection circuits are generally not used for output buffers and input/output (I/O) pads due to performance constraints. See for Example, Y. Wei, Y. Lob, C. Wang and C. Hu, *MOSFET Drain Engineering for ESD Performance*, EOS/ESD Symposium, 1992, pp. 143–148. For output buffers and I/O buffers, n-channel pull-down transistors must be properly designed to ensure adequate ESD performance. These n-channel pull-down transistors used for I/O buffers, n-channel pull-down transistors are sometimes referred to as ESD transistors However, using metal-silicide regions in source-drain regions of ESD transistors can seriously degrade ESD hardness, increasing the possibility of ESD damage to logic circuitry within semiconductor devices. See for example, C. Duvvury, R. N. Rountree, Y. Fong, and R. A. McPhee, *ESD Phenomena and Protection Issues in CMOS Output Buffers*, IEEE/IRPS, 1987, pp. 174–180. Because of this it is desirable to prevent metal-silicide regions from being included as part of the drain region of an ESD transistor. See, for example, D. Krakauer, K. Mistry, *ESD Protection in a 3.3 Volt Sub-Micron Silicided CMOS Technology*, EOS/ESD Symposium, 1992, pp. 250–257. It is desirable therefore, to formulate an efficient and effective method which allows selective salicidation of source/drain regions.

SUMMARY OF THE INVENTION

In accordance with the preferred embodiment of the present invention, a method for selective salicidation of source/drain regions of a transistor is presented. An implant into a first plurality of transistor source/drain regions on an integrated circuit is performed. As a result of the implant, doping density of the first plurality of transistor source/drain regions is greater than doping density of a second plurality of transistor source/drain regions on the integrated circuit. For example, the implant is an ESD implant of atoms into drain regions of transistors used to provide protection for the integrated circuit against electrostatic discharge. Alternately, the implant is an $n^+$ or a $p^+$ source/drain implant.

The integrated circuit is heated to a heating temperature sufficient to produce oxidation regions immediately over the first plurality of transistor source/drain regions and the second plurality of transistor source/drain regions. The heating temperature is chosen so that the oxidation regions immediately over the first plurality of transistor source/drain regions are thicker than the oxidation regions immediately over the second plurality of transistor source/drain regions.

A metal layer is formed over the first plurality of transistor source/drain regions and the second plurality of transistor source/drain regions. The metal layer is annealed at a temperature such that the metal reacts to form metal-silicide over the second plurality of transistor source/drain regions, but not over the first plurality of transistor source/drain regions. The unreacted metal is stripped off over the first plurality of transistor source/drain regions. In the preferred embodiment of the present invention, a second anneal is then performed to fully form metal-silicide over the second plurality of transistor source/drain regions.

The present invention allows for a relatively uncomplicated process for selective salicidation of source/drain regions of a transistor. The process is self-aligned and compatible with current semiconductor processes.

DESCRIPTION OF THE PREFERRED EMBODIMENT

Figure 1:
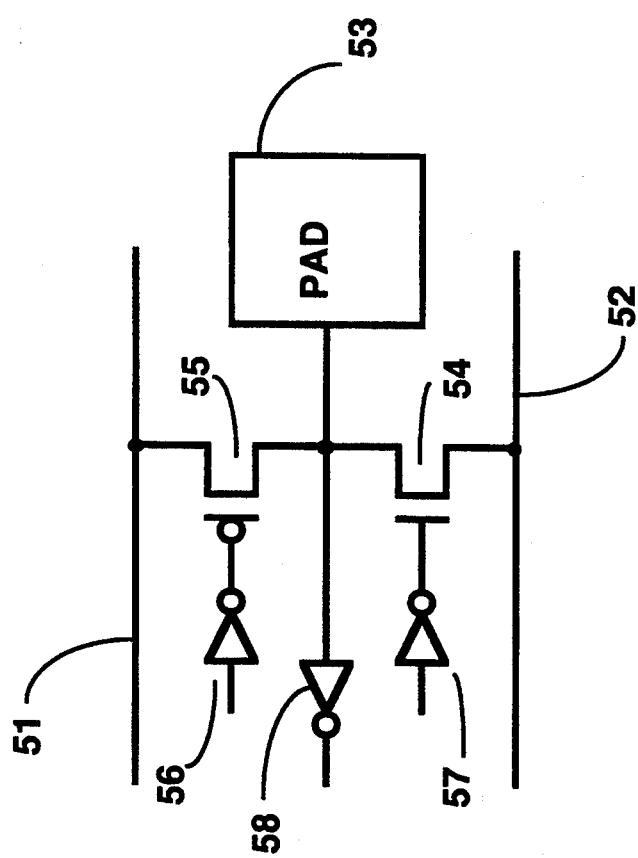
FIG. 1 shows an I/O buffer circuit for an integrated circuit.

FIG. 1 shows an example of a buffer circuit for a pad 53. Many other types of buffer circuits exist to which the teachings of the present invention could be applied. The buffer circuit shown in FIG. 1 selects to be electrically connected to pad 53 either a $V_{DD}$ voltage on a $V_{DD}$ line 51, or a $V_{SS}$ voltage on a $V_{SS}$ line 52. The buffer circuit includes a p-channel buffer transistor 55 and an n-channel buffer transistor 54. P-channel buffer transistor 55 is controlled by an inverter 56. N-channel buffer transistor 54 is controlled by an inverter 57. Input from pad 53 is received by an inverter 58. In a first preferred embodiment of the present invention, n-channel buffer transistor 54 is an asymmetric electro-static discharge buffer transistor. In a second preferred embodiment of the present invention, n-channel buffer transistor is a symmetric electro-static discharge buffer transistor in which a metal-silicide is not present over either the source or the drain region.

For the first preferred embodiment of the present invention, the requirements for a source junction and a drain junction of an output buffer transistor are quite different. For the drain junction, some kind of drain engineering to achieve a gradient drain junction is normally required. For example a lightly doped drain (LDD) or a double diffused drain (DDD) can be used. This will meet the required hot-carrier lifetime while simultaneously maintaining a sufficient electro-static discharge (ESD) threshold, and a large enough snapback voltage to allow high-voltage burn-in (B/I). Furthermore in the first preferred embodiment or the present invention, placing a metal-silicide region over the drain junction of an output buffer transistor is undesirable, as such a metal-silicide drain severely degrades the ESD performance by reducing ESD hardness.

However, in the first preferred embodiment of the present invention, for the source junction of an output buffer transistor, the most important criteria is to achieve minimum source series resistance. Therefore, a heavily-doped source junction (i.e., instead of LDD), and a metal-silicide source junction are desirable for optimal transistor performance. A heavily-doped source junction reduces the undesirable source series resistance. Source series resistance is more detrimental than drain series resistance in degrading the transistor performance. This is because source series resistance not only adds a series resistance to the source-drain current path, it also degrades the effective gate bias.

A minimum resistance between the different source junctions of NMOS ladder-type pull-down transistors (or multiple looped pull-down transistors) used in CMOS VLSI circuitry is also important in order to ensure that all poly fingers are properly turned on during ESD events, thus promoting good ESD performance.

In the first preferred embodiment of the present invention, asymmetric source-drain junctions are used for ESD buffer transistors. Key features of ESD transistors constructed in accordance with the first preferred embodiment are the incorporation of a drain junction without silicidation with the use of a source region consisting of a conventional n+ junction with silicidation. Local interconnect (such as TiN formed during $TiSi_2$ salicidation) is also proposed to reduce the series resistance between the source junctions of different transistors in the ladder-type or multiple looped pull-down transistors whenever a short metal routing is not available.

In the second preferred embodiment of the present invention, ESD buffer transistors incorporate both the source junction and the drain junction without silicidation while the other transistors on the circuit incorporate source/drain junctions with silicidation.

Figure 2:
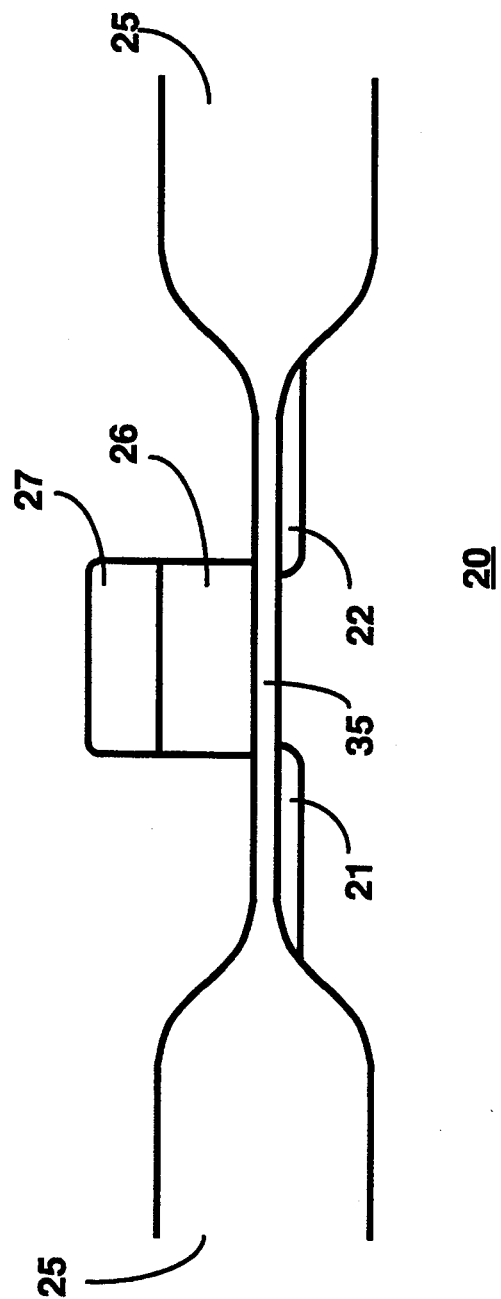
FIGS. 2 and 3 illustrate processing steps for producing an electro-static discharge transistor in accordance with a preferred embodiment of the present invention.
Figure 3:
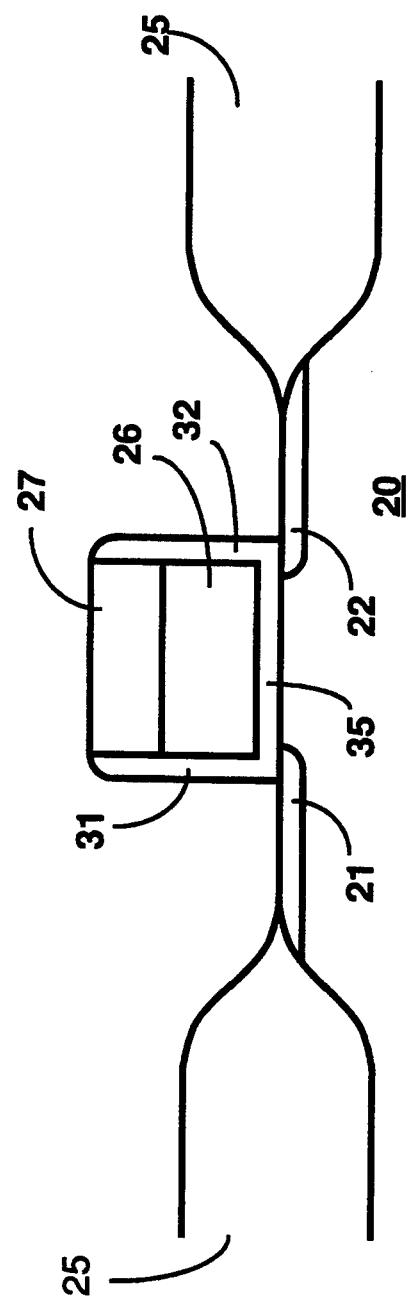

FIG. 2 and FIG. 3 illustrate processing steps used for producing an electro-static discharge transistor in accordance with the first and second preferred embodiments of the present invention.

The structure shown in FIG. 2 is formed in a well 20 of first conductivity type within a substrate. For example, the substrate may be of p-type material doped with $10^{15}$ atoms per cubic centimeter. Alternately, the substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A first gate region 26 is formed on gate oxide layer 35 using a mask and etch process. First gate region 26 may be made of polysilicon, for example, doped with n-type atoms at $10^{20}$ atoms per cubic centimeter.

Gate region 26 may be formed, for example, by chemical vapor deposition (CVD) of a polysilicon layer. The polysilicon is doped using $POCl_3$. Alternately, an implant of Phosphorus or Arsenic atoms may be used. If a polycide gate is desired, a metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On top of the polysilicon (or polycide) layer there may be deposited a dielectric layer. The deposition of the dielectric layer is done, for example, using chemical vapor deposition (CVD) oxide. Alternately, deposition of the dielectric layer may be omitted. Using a mask, an etch is performed on both sides of a metal-silicide region 27 on top of first gate region 26. The etch exposes the gate oxide layer on top of the substrate.

On the sides of gate region 26 and region 27 are implanted a region 21 and a region 22 of second conductivity type. Region 21 and region 22 act as source/drain regions for a transistor. For example, region 21 and region 22 are n− regions doped with Phosphorus at $10^{18}$ atoms per cubic centimeter. For example, region 21 and region 22 extend 0.15 micrometers below the surface of the substrate. Alternately, region 21 and region 22 may be p-regions. The resultant structure is shown in FIG. 2.

The exposed portions of the gate oxide layer 35 are dipped off using, for example, a fifty to one mixture of $H_2O$ and HF. A deposition and etch back are used to form a sidewall region 31 and a sidewall region 32, which are on opposite sides of polysilicon region 26. Sidewall region 31 and sidewall region 32 serve as spacers around polysilicon region 26. Sidewall region 31 and sidewall region 32 may be formed, for example by oxide deposition and etch back. Alternately, sidewall region 31 and sidewall region 32 may be formed by nitride deposition and etch back. For example, sidewall region 31 and sidewall region 32 are CVD oxide and each extends approximately 0.3 microns outward from polysilicon region 26. A dilute Hydrogen-Fluorine (HF) dip may be used to clear residual oxide over source/drain region 21 and source/drain region 22. The resulting structure is shown in FIG. 3.

Figure 4:
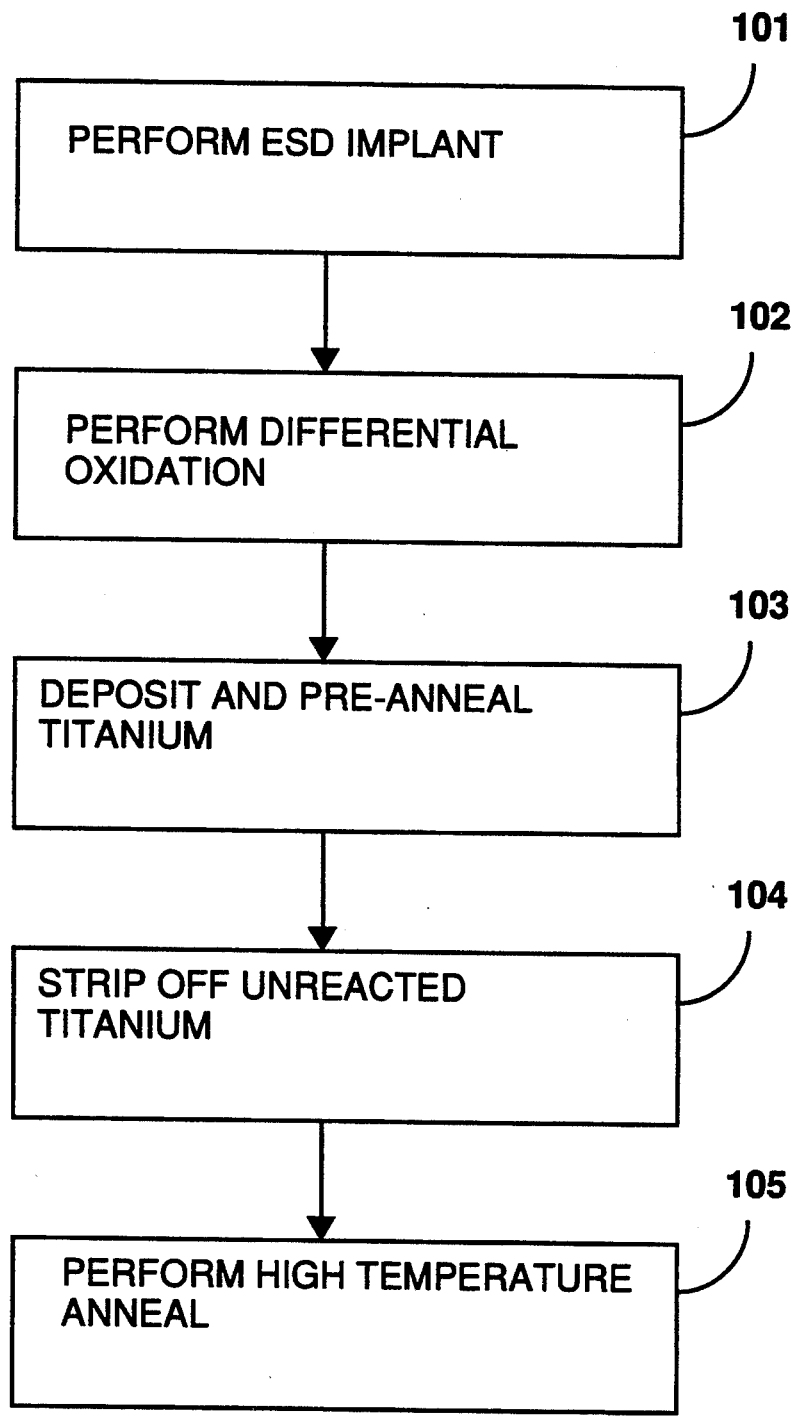
FIG. 4 shows a flowchart for a process for selective salicidation of source/drain regions of a transistor in accordance with a first and second preferred embodiment of the present invention.

FIG. 4 shows simplified method steps for the first and second preferred embodiments of the present invention. In a step 101, a ESD implant is performed. For n-channel pull-down ESD transistors used in circuits utilizing CMOS technology, an ESD implant region 43 is formed by implanting Phosphorus atoms at, for example 4 times $10^{15}$ atoms per square centimeter. ESD implant region 43 extends, for example, approximately 0.2 micrometers below the surface of the substrate. In the first preferred embodiment of the present invention, ESD implant regions are formed on a circuit only at the drain junction of the ESD n-channel pull-down transistors. This is achieved by designing an ESD implant mask such that the source side of the ESD pull down transistors are covered by photo resist. This can be done because the length of transistor gate 26 is normally larger than twice the alignment tolerance. The ESD implant mask also covers the source-drain regions of the other transistors, leaving exposed only the drain region of ESD transistors.

In the first preferred embodiment an ESD implant (region 43) is employed. For process flows that do not employ an ESD implant, a regular-type n+ source/drain implant can be performed instead only to the drain junction of the n+ ESD transistors. In such a case, for example, an implant of n+-type atoms at $10^{20}$ atoms per cubic centimeter is made to a depth of, for example, approximately 0.25 micrometers.

After the implant of ESD region 43, a selective silicidation scheme is employed to form metal-silicide source/drain junctions throughout the circuit except the drain junction of the n-channel pull-down ESD transistors. This is done, for example, by utilizing the enhanced oxidation rate for a heavily-doped region to prevent silicidation over the drain region of the ESD transistors.

Specifically, in a step 102, a differential oxidation is performed to grow a very thin (e.g., less than 5 nanometers thick) oxide on top of the lightly doped source-drain regions throughout the circuit. This is done, for example, by using a low temperature (for example 800 degrees Centigrade) and wet ambient to take advantage of the enhanced oxidation rate of a heavily doped region. The result is a very thin layer (for example, less than 5 nanometers) of oxide on top of the lightly doped source/drain regions where there has been no ESD implant. These lightly doped source/drain regions throughout the circuit include the source and drain junctions of all non-ESD transistors throughout the circuit, as well as the source and drain junctions of the p-channel pull-up ESD transistors and the source junction of the ESD pull-down n-channel transistors. A much thicker layer (for example, 10 to 15 nanometers) of oxide forms over the source/drain regions which includes the ESD implant into region 43.

In a step 103, A thin layer of metal is deposited over the substrate. In the preferred embodiment, the metal is Titanium (Ti). Alternately, the metal layer may consist of another metal such as, for example, Molybdenum (Mo), Chromium (Cr), Nickel (Ni), Platinum (Pt), Cobalt (Co), or Tantalum (Ta). While in the following discussion of the present invention, reference is made to Titanium layers, for any reference to Titanium, these other metals may be substituted for Titanium. The layer of metal is, for example, 0.05 microns thick. After deposition of the metal layer, an anneal is used to form Titanium-silicide (TiSix) over all source/drain regions except the drain region of the n-channel ESD transistors. This anneal may be performed either in a furnace or as a rapid thermal anneal.

For example, a rapid thermal anneal may be done by heating the substrate to approximately 600 to 700 degrees Celsius for a period of approximately 15 seconds. Alternately, in a furnace, the substrate may be heated to approximately 625 degrees Celsius for a period of approximately 60 seconds in a nitrogen ($N_2$) ambient.

As a result of the anneal, Titanium-silicide (TiSix) is formed over all source/drain regions except the drain region of the n-channel ESD transistors. That is, where the oxide is thin, a silicidation through oxide (SITOX) occurs. Where the oxide is thick, i.e., over the drain region of the n-channel ESD transistors, no silicidation occurs.

In a step 104, the unreacted Titanium on top of the source-drain of the ESD transistors and elsewhere is stripped off, for example using a rinse of a mixture of $NH_4OH$, $H_2O_2$ and $H_2O$. Afterwards, in a step 105, a high-temp anneal (e.g., 800° C.) is applied to fully formed the highly conductive metal-silicide on the source-drain of the regular transistors.

For ESD pull-down n-channel transistors, the result is that a metal-silicide region 49 is formed over the source junction; however, no metal-silicide region is formed over drain junction.

After forming metal-silicide region 49, disposable sidewall spacer 31 on the source side of the n-channel ESD transistor may (optionally) be removed. This is done, for example, using a wet etch. In addition to the disposable sidewall spacers on the source side of all the n-channel ESD transistors, sidewall spacers may (optionally) be removed from all the transistors on the source side only.

Figure 5:
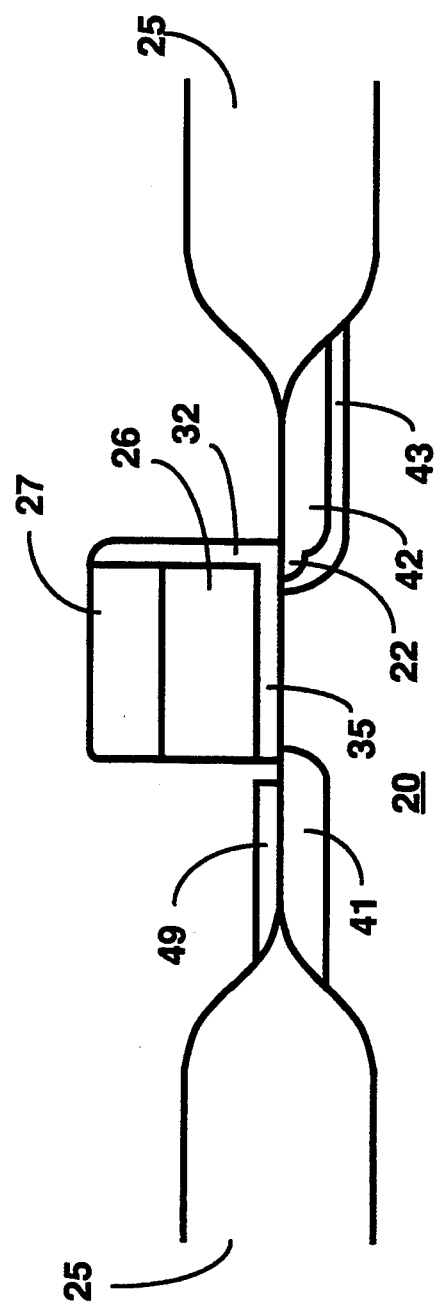
FIG. 5 shows an electro-static discharge transistor formed in accordance with a first preferred embodiment of the present invention.

After the selected disposable sidewall spacers are removed, the regular n+ and p+ source-drain implant can be performed on the circuit. For example, an ion implant is used to dope n+ source region 41 and n+ drain region 42 with n+-type atoms at $10^{20}$ atoms per cubic centimeter. Because sidewall spacer 31 was removed, n+ source region 41 completely overtakes n− region 21. Because sidewall spacer 32 remains, n+ drain region 42 only partially overtakes n− region 22. The n+ implant penetrates the metal-silicide region on the source. The result is seen in FIG. 5.

Figure 6:
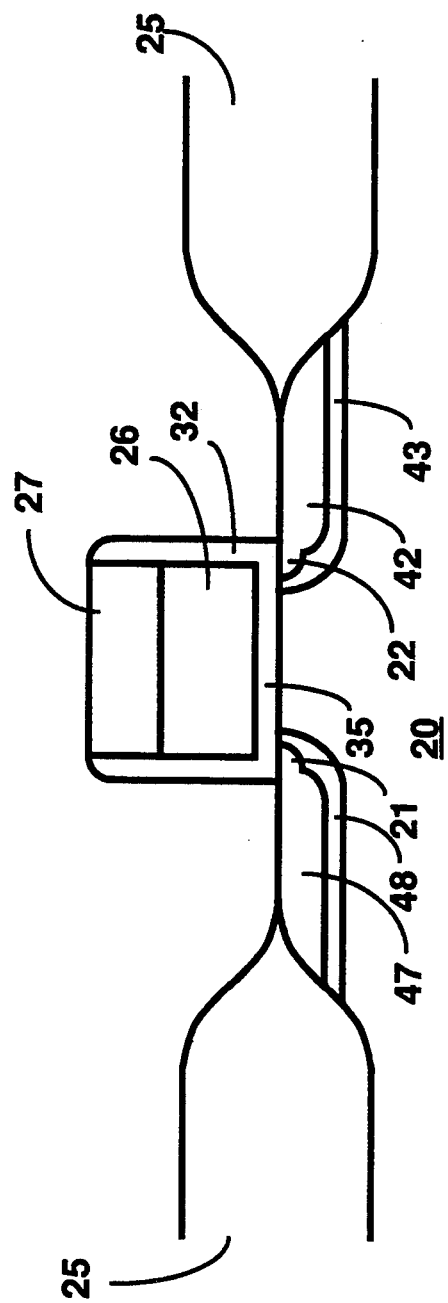
FIG. 6 shows an electro-static discharge transistor in accordance with a second preferred embodiment of the present invention.

In the second preferred embodiment of the present invention, no metal-silicide will be formed on either source or drain regions of the ESD transistors. In this case, in step 101, an implant is performed into both the drain and the source regions of the n-channel pull-down ESD transistors resulting in the formation of ESD implant region 43 and an ESD implant region 48. The performance of step 102 will result in a much thicker layer of oxide forming over the both the source and drain regions of the n-channel pull-down ESD transistors. The performance of step 103 will result in Titanium-silicide (TiSix) being formed over all source/drain regions except the source and the drain regions of the n-channel ESD transistors. After performance of step 104 and step 105, the regular n+ and p+ source-drain implant can be performed on the circuit. For example, an ion implant is used to dope n+ source region 41 and n+ drain region 47 with n+-type atoms at $10^{20}$ atoms per cubic centimeter. Because in the second preferred embodiment, sidewall spacer 31 was not removed, n+ source region 47 does not overtake n− region 21. Instead, n+ drain region 47 only partially overtakes n− region 22. The result is seen in FIG. 6.

While, the above examples represents preferred embodiments of the present invention, the present invention may be embodied using other processing steps. For example, in the above embodiments, a polycide gate is assumed, so there is no need to form metal-silicide on top of the polycide gate. A top oxide stack could be used in the polycide gate stack to isolate the polycide from contacting with the Titanium in this example, if needed. Otherwise, the thermal oxide grown on top of the polycide can also serve the isolation purpose.

For the case of a polysilicon gate, formation of metal-silicide on both the source-drain and the gate is desirable. To do this, a dielectric material which can be differentially etched from the sidewall dielectric (e.g., nitride if oxide is used for the sidewall dielectric; and oxide if nitride is used for the sidewall dielectric), can be added on top of the polysilicon gate as part of the gate stack. For example, in the case of the use of oxide sidewalls, a 2000 Å thick region of nitride is placed on top of the polysilicon gate. In the case of the use of nitride sidewalls, for example, a 2000 Å thick region of oxide is placed on top of the polysilicon gate. Assuming nitride is used, this top dielectric can be selectively stripped off by wet chemistry (e.g., phosphoric acid) immediately before the Titanium deposition.

Figure 7:
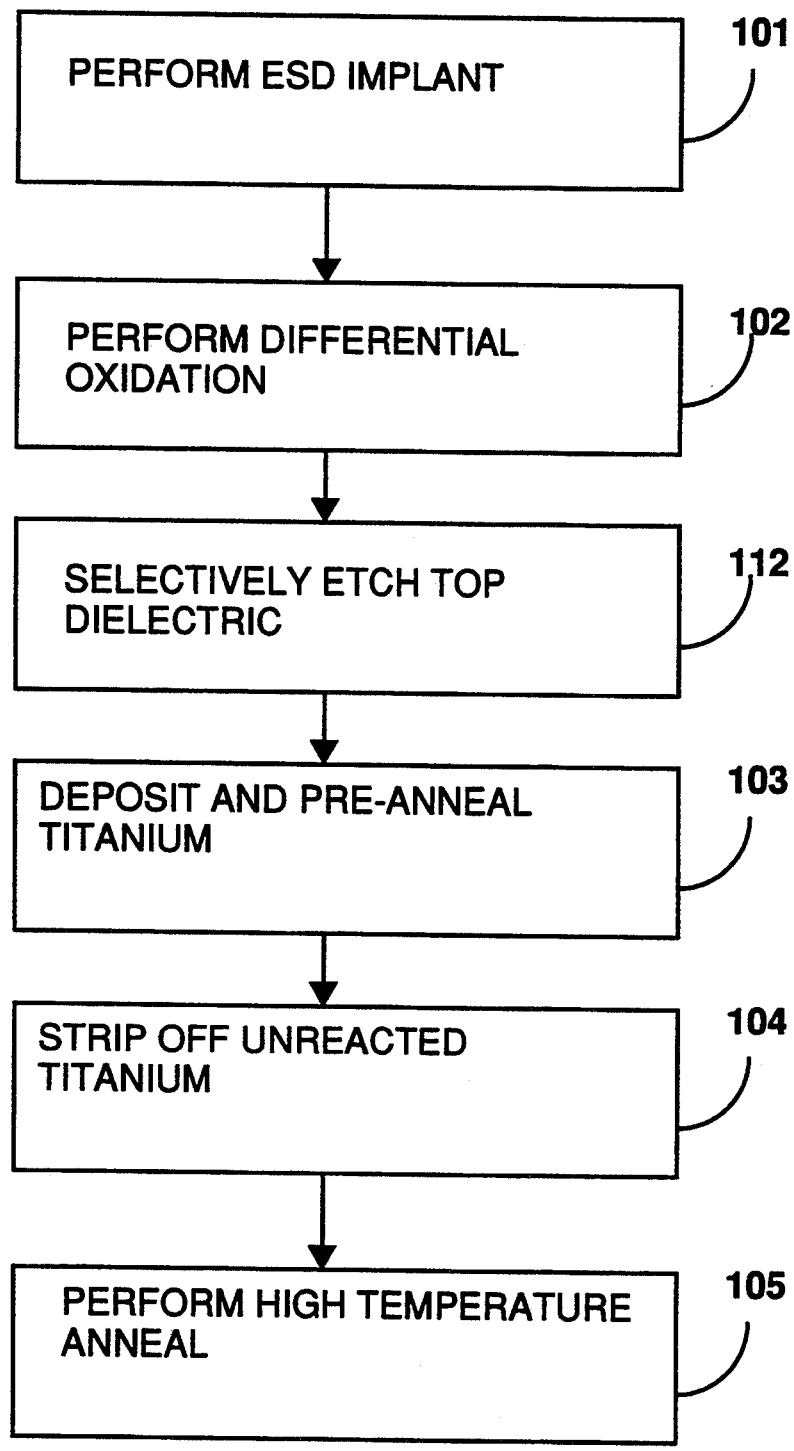
FIG. 7 shows a flowchart for a process for selective salicidation of source/drain regions of a transistor in accordance with an alternate preferred embodiment of the present invention.

For example, as shown in FIG. 7, after the differential oxidation is performed in step 102, in a step 112, the dielectric on top of the polysilicon gate is selectively etched. In this way, metal-silicide can be formed on both the source-drain of the regular transistors, as well as on the polysilicon gate of all transistors (including ESD transistors), and all polysilicon interconnects. Also, in the first preferred embodiment described above, the LDD dose in region 21 was overtaken by the later n+ source/drain implant at the source junction of the ESD transistors. For a process where this would not be the case, the LDD implant mask can be designed so that the source junction of the ESD transistors do not receive the LDD implant. In such a case, n− region 21 would never be formed.

Also, in the preferred embodiments described above, the n+ and p+ source-drain implants were performed after metal-silicide formation. Alternately, the n+ and p+ source-drain implants could be performed before deposit of the Titanium.

Figure 8:
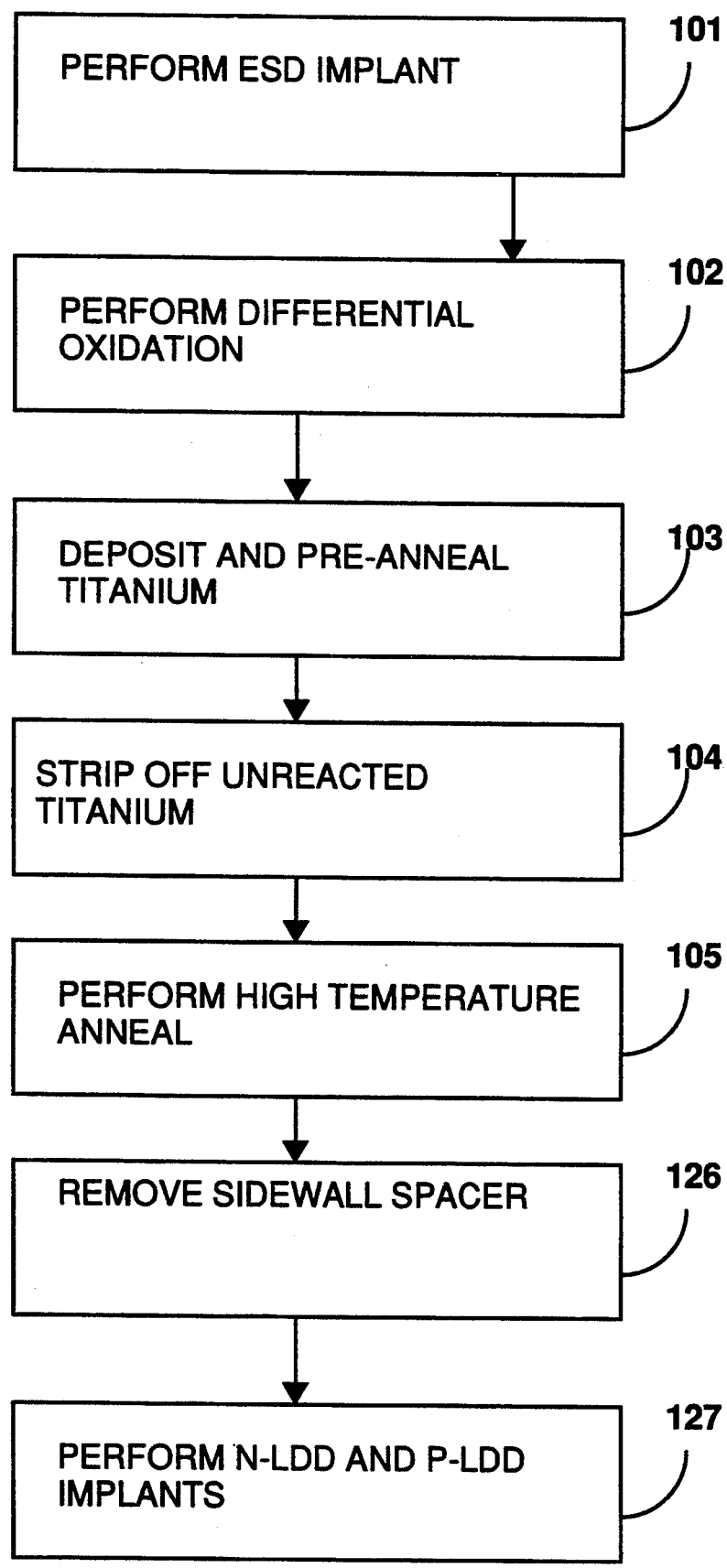
FIG. 8 shows a flowchart for a process for selective salicidation of source/drain regions of a transistor in accordance with another alternate preferred embodiment of the present invention.

Additionally, the n-LDD and p-LDD implants may be delayed. For example, as shown in FIG. 8, after the high temperature anneal is performed in step 105, in a step 126 the sidewall spacers 31 and 32 are stripped away. In a step 127, the n-LDD and p-LDD implants are performed.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for selective salicidation of source/drain regions of a transistor, the method comprising the steps of:
    (a) performing an implant into a first plurality of transistor source/drain regions on an integrated circuit, so that doping density of the first plurality of transistor source/drain regions is greater than doping density of a second plurality of transistor source/drain regions on the integrated circuit;
    (b) heating the integrated circuit to a heating temperature sufficient to produce oxidation regions immediately over the first plurality of transistor source/drain regions and the second plurality of transistor source/drain regions, the heating temperature being chosen so that the oxidation regions immediately over the first plurality of transistor source/drain regions are thicker than the oxidation regions immediately over the second plurality of transistor source/drain regions;
    (c) depositing a metal layer on the oxidation regions produced over the first plurality of transistor source/drain regions and the second plurality of transistor source/drain regions;
    (d) annealing the metal layer deposited in step (c), the annealing being done at a temperature such that the metal reacts to form metal-silicide over the second plurality of transistor source/drain regions, but not over the first plurality of transistor source/drain regions; and,
    (e) stripping off the unreacted metal from over the first plurality of transistor source/drain regions.

2. A method as in claim 1 wherein the implant performed in step (a) is an implant of atoms into drain regions of transistors used to provide protection for the integrated circuit against electrostatic discharge.

3. A method as in claim 1 wherein before step (a), a low doping density implant is performed in the first plurality of transistor source/drain regions and the second plurality of transistor source/drain regions.

4. A method as in claim 1 wherein the implant performed in step (a) is an n+ source/drain implant.

5. A method as in claim 1 wherein the implant performed in step (a) is a p+ source/drain implant.

6. A method as in claim 1 wherein in step (b), the integrated circuit is in a wet ambient and is heated to 800 degrees Centigrade.

7. A method as in claim 1 wherein in step (b) a ratio of thickness of the oxidation regions immediately over the first plurality of transistor source/drain regions to thickness of the oxidation regions immediately over the second plurality of transistor source/drain regions is at least two to one.

8. A method as in claim 1 wherein the metal layer deposited in step (c) is Titanium.

9. A method as in claim 1 wherein the annealing performed in step (d) is a rapid thermal anneal at 700 degrees centigrade for 15 seconds.

10. A method as in claim 1 wherein the annealing performed in step (d) is a rapid thermal anneal at 625 degrees centigrade for 60 seconds.

11. A method as in claim 1, additionally comprising the step of:
    (f) after step (e), performing a second anneal to fully form metal-silicide over the second plurality of transistor source/drain regions.

12. A method as in claim 1 additionally comprising the step of:
    before step (a), forming polycide gates regions for the integrated circuit.

13. A method as in claim 1 additionally comprising the steps of:
    before step (a), forming polysilicon gate regions for the integrated circuit, and forming dielectric regions over the polysilicon gate regions.

14. A method as in claim 13 additionally comprising the step of:
    before step (c) removing the dielectric regions from the polysilicon gate regions.

15. A method as in claim 1 wherein before step (a) the following steps are performed:
   forming gate regions for the integrated circuit; and,
   forming sidewall spacers around the gate regions.

16. A method as in claim 15 additionally comprising the step of:
   after forming the gate regions and before forming the sidewall spacers, performing low doping density implants in the first plurality of transistor source/drain regions and the second plurality of transistor source/drain regions.

17. A method as in claim 16 wherein after step (e) the following steps are performed:
   removing the sidewall spacers which are immediately adjacent to the second plurality of transistor source/drain regions;
   performing source drain implants into the first plurality of transistor source/drain regions and into the second plurality of transistor source/drain regions.

18. A method as in claim 15 wherein after step (e) the following steps are performed:
   (f) removing the sidewall spacers from around the gate regions; and,
   (g) performing low doping density implants in the first plurality of transistor source/drain regions and the second plurality of transistor source/drain regions.

19. A method as in claim 15 wherein the first plurality of transistor source/drain regions are drain regions of transistors used to provide protection for the integrated circuit against electrostatic discharge.

20. A method as in claim 15 wherein the first plurality of transistor source/drain regions are drain regions and source regions of transistors used to provide protection for the integrated circuit against electrostatic discharge.

* * * * *